United States Patent [19]

Golab

[11] Patent Number: 4,831,287

[45] Date of Patent: May 16, 1989

[54] LATCHING SENSE AMPLIFIER

[75] Inventor: James S. Golab, Austin, Tex.

[73] Assignee: Motorola, Inc., Schaumburg, Ill.

[21] Appl. No.: 179,723

[22] Filed: Apr. 11, 1988

[51] Int. Cl.[4] .............................................. H03F 3/45
[52] U.S. Cl. ..................................... 307/530; 365/207
[58] Field of Search ...................... 307/276, 355, 530;
330/252, 253, 277, 307; 365/203, 207, 208

[56] References Cited

U.S. PATENT DOCUMENTS

| | | | |
|---|---|---|---|
| 4,123,799 | 10/1978 | Peterson | 307/530 X |
| 4,412,143 | 10/1983 | Patella et al. | 365/208 X |
| 4,613,957 | 9/1986 | Iwahashi | 365/207 X |

*Primary Examiner*—Steven Mottola
*Attorney, Agent, or Firm*—James L. Clingan Jr.

[57] ABSTRACT

A sense amplifier for fast and reliable sensing of a small voltage differential is accomplished by the integration of a latch which uses regenerative feedback. Complementary devices are used within the sense amplifier to modify its configuration from an amplifier to a latch. The integration of the latch for gain allows the use of a single-ended sense amplifier section, as opposed to requiring a double-ended design for level shifting and symmetrical sensing of '0' and '1'. The output is a pair of full-rail complementary signals that can be directly used by standard CMOS logic downstream.

8 Claims, 1 Drawing Sheet

LATCHING SENSE AMPLIFIER

FIELD OF THE INVENTION

This invention relates generally to sensing circuits for a memory or microprocessor, and more specifically, to sensing circuits which provide a latched output.

BACKGROUND OF THE INVENTION

As technology gravitates towards denser and faster integrated circuits, efficient utilization of chip area becomes inceasingly significant. In the case of amplifier technology, where fast sensing of a voltage differential is required, the demands for speed and reliability necessitate more innovative aproaches to circuit design. High-speed sensing and latching of data is particularly desirable in memories and microprocessors, however standard sense amplifiers are often too slow for use in these environments. Designs for faster sense amplifiers generally require additional chip area.

The reduction of both device size and device count, in circuit implementation of fast sense amplifiers, is required for efficient utilization of chip area. In the prior art are sense amplifiers implemented using a single differential portion. Single-ended amplifier designs may reduce device count, but they require additional circuitry to generate symmetric latched outputs. Generally, single-ended sense amplifiers are too slow for use in high-performance microprocessors. Consequently, sense amplifiers were commonly implemented with a double-ended amplifier design, which provides symmetric outputs. These double-ended amplifiers use two differential portions, each comprised generally of a current mirror, and an inverting amplifier. Sense amplifiers using double-ended designs, for level-shifting and symmetrical sensing of logic '0' and '1', may provide fast sensing, however they also require more devices. As a rule, the chip area required for double-ended amplifiers is larger, and they require more DC current for their operation. Furthermore, the use of a latch in series with the amplifier takes up additional chip area.

SUMMARY OF THE INVENTION

An object of the present invention is to provide an improved sense amplifier.

Another object of the invention is to provide a high-speed sense amplifier requiring reduced chip area.

These and other objects of the invention are achieved in a sense amplifier for amplifying in a sense mode a voltage difference, representative of a logic state between a first input signal and a second input signal in a sense amplifying mode, and for providing first and second output signals, representative of said logic state, in a latch mode. The sense amplifier has a first transistor having a control electrode coupled to a first node, a first current electrode coupled to a first power supply terminal, and a second current electrode for providing a first output signal at one of a first and second logic state. A second transistor has a control electrode for receiving the first input signal, a first current electrode coupled to the second current electrode of the first transistor, and a second current electrode coupled to the second power supply terminal. A third transistor has a control electrode coupled to a second node, a first current electrode coupled to a first power supply terminal, and a second current electrode for providing a second output signal at a logic state opposite to the logic state of the first output signal. A fourth transistor has a control electrode for receiving the second input signal, a first current electrode coupled to the second current electrode of the third transistor, and a second current electrode coupled to the second power supply terminal. A first switching circuit couples the control electrode of the first transistor to the control electrode of the third transistor when the amplifier is in the sensing mode. A second switching circuit couples the control electrode of the first transistor to the second current electrode of the third transistor when the amplifier is in the latching mode.

DESCRIPTION OF THE INVENTION

Figure 1:
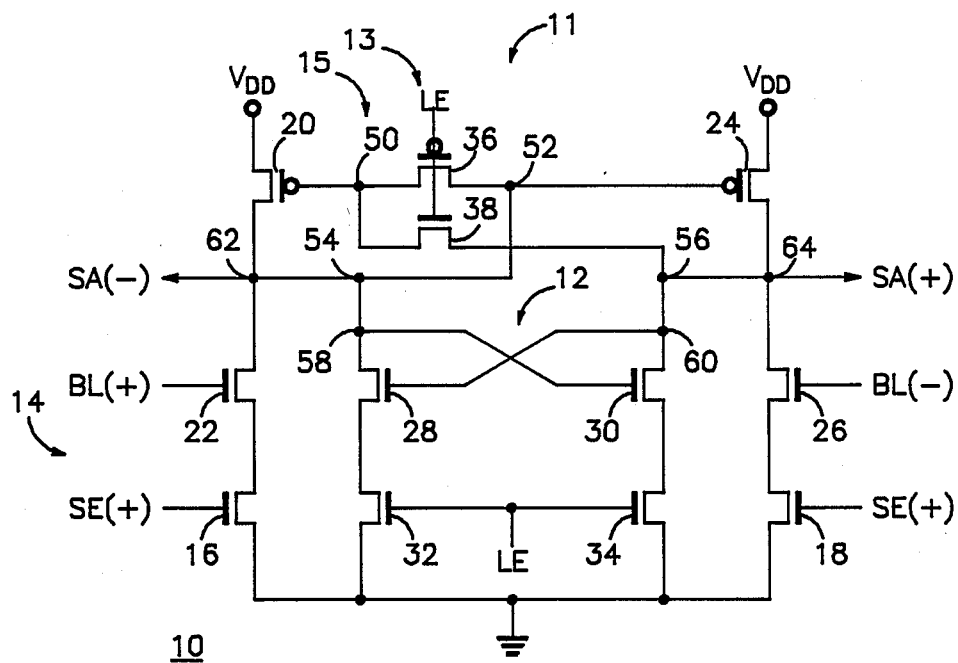
FIG. 1 is a circuit diagram of a latching sense amplifier according to a preferred embodiment of the present invention.

Shown in FIG. 1 is a latching sense amplifier 10 according to a preferred embodiment of the invention comprised generally of a single differential portion 11, a latch 12, a function switching portion 13 for modifying the configuration of the latching sense amplifier 10 from an amplifier, to a latch. Differential portion 11 is comprised of a differential amplifier 14, and a current mirror 15. Differential amplifier 14 is comprised of an N channel transistor 22, an N channel transistor 26, and a pair of N channel enabling transistors 16 and 18. The latch 12 is comprised of two cross-coupled N channel transistors 28 and 30, an N channel enable transistor 32, and an N channel enable transistor 34. Function switching portion 13 is comprised of a P channel enable transistor 36 and an N channel transistor 38. Current mirror 15 comprises a P channel transistor 20 which acts as a master of current mirror 15 and a P channel transistor 24 which acts as a slave of current mirror 15.

Transistor 20 has a source connected to a positive power supply terminal VDD for receiving a positive power supply voltage, a drain for providing a complementary output signal SA(−), and a gate. Transistor 22 has a drain connected to the drain of transistor 20, a gate for receiving an input signal BL(+), and a source. Transistor 16 has a drain connected to the source of transistor 22, a gate for receiving an input signal SE(+), and a source connected to a negative power supply terminal, shown as ground. Transistor 24 has a source connected to VDD, a drain for providing an output signal SA(+), and a gate. Transistor 26 has a drain connected to the drain of transistor 24, and a gate for receiving an input signal BL(−). Transistor 18 has a drain connected to the source of transistor 24, a gate for receiving an input signal SE(+), and a source connected to ground. In the sense amplifier configuration, the connection of the drain and gate of transistor 20 and the drain of transistor 22 form a current mirror, thereby controlling the conductivity of transistor 24.

Transistor 36, which uses the bilateral characteristics of an insulated gate field effect transistor, has a first current electrode connected to a node 50, a gate for receiving a latch enable input signal LE, and a second current electrode connected to a node 52. Transistor 38 has a first current electrode connected to node 50, a gate for receiving the latch enable input signal LE, and a second current electrode connected to node 52. Transistor 28 has a drain connected to node 58, a gate for receiving an output signal SA(+), and a source. Transistor 30 has a drain connected to node 60, a gate for receiving a complementary output signal SA(−), and a source. Transistor 32 has a drain connected to the source of transistor 28, a gate for receiving the latch enable signal, and a source connected to ground. Transistor 34 has a drain connected to the surface of transistor 30, a gate for receiving the latch enable signal LE, and a source connected to ground.

Figure 2:
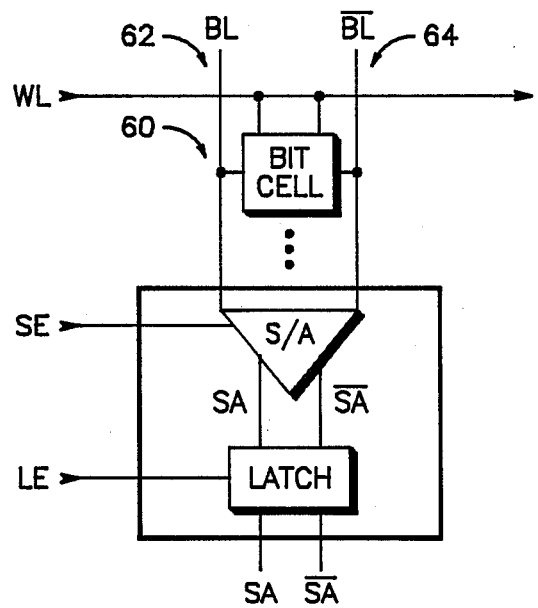
FIG. 2 is a block diagram of the sense amplifier of FIG. 1 coupled to a memory bit cell.

Amplifier 10 is appropriate for use as a sense amplifier in a static ram access memory (SRAM). Shown in FIG. 2 is a block diagram of amplifier 10 coupled to a bit cell 60 via a pair of bit lines BL(+) 62 and B(−) 64. Bit cell 60 is enabled in response to receiving a signal on the word line WL. When the bit cell is enabled, the selected bit cell 60 causes one of the pair of bit lines to be reduced in voltage. Amplifier 10 detects the voltage differential between BL 62 and BL 64.

Amplifier 10 in FIG. 1 has a sensing mode which is implemented when the signal LE is a logic low and signal SE switches to a logic high. Since LE is a logic low, transistor 36 couples to the gates of P channel transistors 20 and 24 together, which causes transistor 20 and 24 of the current mirror 15 to act as loads for the differential amlifier 14. Signal SE switching to a logic high causes transistors 16 and 18 to become conductive.

In the case when BL(+) is lower in voltage than BL(−), transistor 22 becomes less conductive and draws less current from transistor 20. Since less current passes through transistor 22, signal SA(−) rises in voltage. As the potential of output signal SA(−) rises in voltage, transistor 24 becomes less conductive, causing a drop in voltage of signal SA(+) as is conventional for a current mirror type differential amplifier. In the case where BL(−) is lower in voltage than BL(+), transistor 26 becomes less conductive and draws less current from transistor 24. Since BL(+) keeps the bias constant on transistor 24, SA(+) rises in voltage rapidly, as BL(−) draws less current from transistor 24. Output signal SA(−) drops in voltage, as transistor 22 draws current from transistor 20. Thus, as the potential of output signal SA(+) rises in voltage, output signal SA(−) drops in voltage.

Amplifier 10 has a latching mode which is entered by signal SE switching to a logic low, and the latch enable signal LE switching to a logic high. Signal LE switching to a logic high enables latch 12. Signal LE switching to a logic high causes transistors 32, 34 and 38 to become conductive, and allows a conduction path from the drains of P channel load transistors 20 and 24 to the respective gates of the cross-coupled N channel transistors 28 and 30 of the latch 12, and the respective gates of transistors 24 and 20. Due to the cross-coupled interconnection of the N channel transistors 28 and 30, and P channel transistors 20 and 24, latch 12 is regenerative. In the case where the SA(−) is at a higher voltage level than SA(+) when the latch mode is entered, the voltages of signal SA(−) further rises as a function of the decline in conductivity of transistor 28 and increase of conductivity of transistor 20. Similarly, the voltage of signal SA(+) further drops as a function of the increase in conductivity of transistor 30 and the decrease in conductivity of transistor 24. Consequently, the decline in voltage at node 64 occurs very rapidly, which forces output signal SA(+) to drop in voltage rapidly. Thus, the latching mode provides additional amplification of output signals SA(−) and SA(+), while latching their respective voltage levels at or near ground and VDD.

Alternatively, in the case where SA(+) is at a higher voltage level than SA(−) when the latch mode is entered, the voltage of signal SA(+) further rises as a function of the increase in conductivity of transistor 24, and the decrease in conductivity of transistor 20. Similarly, the voltage of signal SA(−) further drops as a function of the increase in conductivity of transistor 28 and the decrease in conductivity of transistor 20. Consequently, the increase in voltage at node 64 occurs very rapidly, which forces output signal SA(+) to increase in voltage very rapidly.

In the sensing mode, trasistor 36 couples the gates of transistors 20 and 24 so that amplifier 10 operates as a current mirror type of differential amplifier. In the latching mode, transistor 38 couples signal SA(+) to the gate of transistor 20 so that amplifier 10 operates as a latch. Since input signal LE provides control for amplifier 10 in both the sensing and latching modes, the timing requirements are eased via the integration of the latch 12 into the sense amplifier 10.

While the invention has been described in a preferred embodiment, it will be apparent to those skilled in the art that the disclosed invention may be modified in numerous ways and many assume many embodiments other than that specifically set out and described above. Accordingly, it is intended by the appended claims to cover all modifications of the invention which fall within the true spirit and scope of the invention.

I claim:

1. A sense amplifier for amplifying in a sense mode a voltage difference, representative of a logic state, between a first input signal and a second input signal, and for providing first and second output signals in a sense amplifying mode, and for providing first and second output signals, representative of said logic state, in a latched condition as a latch mode comprising:

a first transistor having a control electrode coupled to a first node, a first current electrode coupled to a first power supply terminal, and a second current electrode for providing a first output signal at one of a first and second logic state;

a second transistor having a control electrode for receiving the first input signal, a first current electrode coupled to the second current electrode of the first transistor, and a second current electrode coupled to a second power supply terminal;

a third transistor having a control electrode coupled to a second node, a first current electrode coupled to the first power supply terminal, and a second current electrode for providing a second output signal at a logic state opposite to the logic state of the first output signal;

a fourth transistor having a control electrode for receiving the second input signal, a first current electrode coupled to the second current electrode of the third transistor, and a second current electrode coupled to the second power supply terminal;

first switching means for coupling the control electrode of the first transistor to the control electrode of the third transistor when the amplifier is in the sensing mode;

second switching means for coupling the control electrode of the first transistor to the second current electrode of the third transistor when the amplifier is in the latching mode.

2. The sense amplifier of claim 1 wherein the first switching means for coupling the control electrode of the first transistor to the control electrode of the third transistor when the amplifier is in the sensing mode comprises a fifth transistor with a control electrode for receiving a first enable signal, a first current electrode coupled to the first node, and a second current electrode coupled to the second node.

3. The sense amplifier of claim 1 wherein the second switching means for coupling the control electrode of the first transistor to the second current electrode of the third transistor when the amplifier is in the latching mode comprises a sixth transistor with a control electrode for receiving the first enable signal, a first current electrode coupled to the first node, and a second current electrode coupled to the second current electrode of the third transistor.

4. The sense amplifier of claim 1 further comprising a seventh transistor, interposed between the second current electrode of the fourth transistor and the second power supply terminal, having a control electrode for receiving a second enable signal, a first current electrode coupled to the second current electrode of the fourth transistor, and a second current electrode coupled to the second power supply terminal.

5. The sense amplifier of claim 2 further comprising an eighth transistor, interposed between the second current electrode of the second transistor and the second power supply terminal, having a control electrode for receiving the second enable signal, a first current electrode coupled to the second current coupled to the second current electrode of the second transistor, and a second current electrode coupled to the second power supply terminal.

6. The sense amplifier of claim 1 further comprising latch means for latching the logic states of the first and second output signals in response to the latch enable signal.

7. The sense amplifier of claim 4, wherein the latch means comprises:
- a ninth transistor having a control electrode coupled to the second output signal, a first current electrode coupled the first output signal, and a second current electrode coupled to a third power supply terminal;
- a tenth transistor having a control electrode coupled to the first output signal, a first current electrode coupled to the second output signal, and a second current electrode coupled to a fourth power supply terminal;
- an eleventh transistor, interposed between the second current electrode of the ninth transistor and the third power supply terminal, having a control electrode for receiving the latch enable signal, a first current electrode coupled to the second current electrode of the ninth transistor, and a second current electrode coupled to the third power supply terminal;
- a twelfth transistor, interposed between the second current electrode of the tenth transistor and the fourth power supply terminal, having a control electrode for receiving the latch enable signal, a first current electrode coupled to the second current electrode of the tenth transistor, and a second current electrode coupled to the fourth power supply terminal.

8. A sense amplifier comprising:
- a first transistor having a control electrode coupled to a first node, a first current electrode coupled to a first power supply terminal, and a second current electrode for providing a first output signal at one of a first and second logic state;
- a second transistor having a control electrode for receiving a first input signal, a first current electrode coupled to the second current electrode of the first transistor, and a second current electrode coupled to a second power supply terminal;
- a third transistor having a control electrode coupled to a second node, a first current electrode coupled to the first power supply terminal, a second current electrode for providing a second output signal at a logic state opposite to the logic state of the first output signal;
- a fourth transistor having a control electrode for receiving a second input signal, a first current electrode coupled to the second current electrode of the third transistor, and a second electrode coupled to the second power supply terminal;
- a fifth transistor with a control electrode for receiving a first enable signal, a first current electrode coupled to the first node, and a second current electrode coupled to the second node;
- a sixth transistor with a control electrode for receiving the first enable signal, a first current electrode coupled to the first node, and a second current electrode coupled to the current electrode of the third transistor;
- a seventh transistor, interposed between the second current electrode of the fourth transistor and the second power supply terminal, having a control electrode for receiving a second enable signal, a first current electrode coupled to the second current electrode of the fourth transistor, and a second current electrode coupled to the second power supply terminal; and
- an eighth transistor, interposed between the second current electrode of the second transistor and the second power supply terminal, having a control electrode for receiving the second enable signal, a first current electrode coupled to the second current electrode of the second trannsistor, and a second current electrode coupled to the second power supply terminal.

* * * * *